United States Patent
Bi et al.

(10) Patent No.: US 12,212,033 B2
(45) Date of Patent: Jan. 28, 2025

(54) LOW-LOSS TRANSMISSION LINE STRUCTURE COMPRISING A DIELECTRIC LAYER STACKED WITH CONDUCTIVE LAYERS HAVING SIGNAL STRIPS AND GROUND STRIPS AND INCLUDING AIR GROOVES CLOSE TO THE SIGNAL STRIPS

(71) Applicant: HUAZHONG UNIVERSITY OF SCIENCE AND TECHNOLOGY, Hubei (CN)

(72) Inventors: Xiaojun Bi, Hubei (CN); Jian Li, Hubei (CN); Ziang Xu, Hubei (CN); Zixuan Wei, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 18/396,641

(22) Filed: Dec. 26, 2023

(65) Prior Publication Data

US 2024/0222834 A1    Jul. 4, 2024

(30) Foreign Application Priority Data

Dec. 29, 2022 (CN) .......................... 202211706011.2

(51) Int. Cl.
*H01P 3/00* (2006.01)
*H01P 3/08* (2006.01)
*H05K 1/02* (2006.01)

(52) U.S. Cl.
CPC ............. *H01P 3/003* (2013.01); *H01P 3/006* (2013.01); *H01P 3/082* (2013.01); *H01P 3/087* (2013.01); *H05K 1/0219* (2013.01); *H05K 2201/0707* (2013.01)

(58) Field of Classification Search
CPC .......... H01P 3/003; H01P 3/006; H01P 3/082; H01P 3/088
USPC ........................................................... 333/238
See application file for complete search history.

(56) References Cited

U.S. PATENT DOCUMENTS

| | | | |
|---|---|---|---|
| 5,408,053 A * | 4/1995 | Young ................... | H05K 1/0265 174/262 |
| 6,535,088 B1 * | 3/2003 | Sherman et al. ...... | H05K 1/024 333/246 |
| 8,058,953 B2 * | 11/2011 | Cho ........................ | H01P 3/003 257/664 |
| 2001/0040490 A1 * | 11/2001 | Tanaka .................... | H01P 3/088 333/204 |
| 2015/0255847 A1 * | 9/2015 | Reza et al. .............. | H01P 3/003 333/238 |

* cited by examiner

*Primary Examiner* — Benny T Lee
(74) *Attorney, Agent, or Firm* — JCIPRNET

(57) ABSTRACT

The disclosure discloses a low-loss transmission line structure, which belongs to the field of radio frequency transmission lines and includes at least two metal layers stacked in a vertical manner. A dielectric layer is filled between the metal layers. The metal layers include a signal transmission strip in a middle portion. Ground strips are provided on both sides of the signal transmission strip. Through holes are evenly distributed on the dielectric layer, and the signal transmission strips on each of the metal layers are connected through the through holes to form a signal transmission line. The ground strips on each metal layer are connected through the through holes.

8 Claims, 9 Drawing Sheets

LOW-LOSS TRANSMISSION LINE STRUCTURE COMPRISING A DIELECTRIC LAYER STACKED WITH CONDUCTIVE LAYERS HAVING SIGNAL STRIPS AND GROUND STRIPS AND INCLUDING AIR GROOVES CLOSE TO THE SIGNAL STRIPS

CROSS-REFERENCE TO RELATED APPLICATION

This application claims the priority benefit of China application serial no. 202211706011.2, filed on Dec. 29, 2022. The entirety of the above-mentioned patent application is hereby incorporated by reference herein and made a part of this specification.

BACKGROUND

Technical Field

The present disclosure belongs to the field of radio frequency transmission lines, and more specifically, relates to a low-loss transmission line structure.

Description of the Related Art

With the continuous development of microwave integration technology, metal waveguides are gradually replaced by planar transmission structures represented by microstrip lines and coplanar waveguides due to the disadvantages of metal waveguides, such as high manufacturing costs, difficulty in integration, and complex processing techniques. In the meantime, with the continuous development and improvement of wireless communication systems and radar technology, microwave systems continue to evolve to have multi-functions, miniaturization design and low cost. Planar transmission structures such as microstrip lines, coplanar waveguides, and strip lines have the advantages of miniaturization and easy integration, so planar transmission structures are widely used in microwave integrated circuits and microwave systems. Specifically, microstrip line is commonly adopted in microwave antennas and devices due to its advantages of light weight, easy manufacturing and integration, but the disadvantages of microstrip line involve high loss and low power processing capability. During the signal transmission process of conventional transmission lines, the electromagnetic field distributed in the medium increases the loss caused by the dielectric layer. Dielectric loss, conductor loss, and strip line radiation loss cause the overall insertion loss to rise sharply with the increase of frequency, which restricts the trace length of radio frequency and thus increasing the complexity of system integration and design.

SUMMARY OF THE INVENTION

In view of the shortcomings of the existing technology, the purpose of the present disclosure is to provide a low-loss transmission line structure, aiming to solve the problem of high-loss of conventional transmission lines.

In order to achieve the above purpose, the present disclosure provides the low-loss transmission line structure, which includes at least two metal layers stacked in a vertical manner. A dielectric layer is filled between the metal layers. The metal layer includes a signal transmission strip in a middle portion, a ground strip is disposed on both sides of the signal transmission strip, and through holes are evenly distributed on the dielectric layer. The signal transmission strips on each of the metal layers is connected to each other through the through holes to form a signal transmission line, and the ground strip on each of the metal layers is connected through the through holes.

Furthermore, the ground strips on a uppermost metal layer is connected to each other through a low-loss connection structure, and the low-loss connection structure is a metal jumper or a gold-wire bonding wire.

Furthermore, the metal jumpers may be connected to each other to form a metal shield.

Furthermore, air grooves are evenly distributed on both sides of the dielectric layer close to the signal transmission strip.

Furthermore, the air grooves may be through grooves that penetrate upper and lower surfaces of the dielectric layer or shallow grooves that are located on the upper and lower surfaces of the dielectric layer and are not communicated with each other.

Furthermore, a shape of the air groove is circular or polygonal.

Furthermore, the metal jumper may be composed of surface mount components and connected metal sheets.

Furthermore, the ground strips on the uppermost metal layer and the ground strips on a lowermost metal layer are connected to each other through the metal shield.

Furthermore, the dielectric layer is made of an epoxy glass fiber cloth substrate, or a dielectric plate whose surface may be printed with metal, or a low-loss microwave dielectric plate.

Furthermore, there are multiple ground metal layers connected to the uppermost metal layer and the lowermost metal layer through the dielectric layer, the dielectric layers are filled between the ground metal layers, and the ground metal layers are connected through the through holes.

Generally speaking, compared with the related art, the above technical solution conceived by the present disclosure has the following advantageous effects:

(1) The low-loss transmission line structure provided by the present disclosure allows most of the electromagnetic field around the transmission line to exist in air, thereby effectively reducing the loss during signal transmission. In the meantime, the signal transmission strips on two or more metal layers are connected via the through holes to form a signal transmission line structure, which reduces conductor losses, increases power capacity, has a simple structure, and is easy for production.

(2) In addition, the ground strips are connected through the metal jumpers to achieve grounding effect and reduce the interference caused by the asymmetric grounding environment on both sides of the signal transmission line. Moreover, due to the air grooves on the dielectric layer, by reducing the effective volume of the dielectric layer, it is possible to further reduce the loss of transmission signals.

DETAIL DESCRIPTION OF THE EMBODIMENTS

In order to make the purpose, technical solution and advantages of the present disclosure more comprehensible, the present disclosure will be further described in detail below in conjunction with the accompanying drawings and embodiments. It should be understood that the specific embodiments described here are only used to explain the present disclosure, not to limit the present disclosure.

Figure 1:
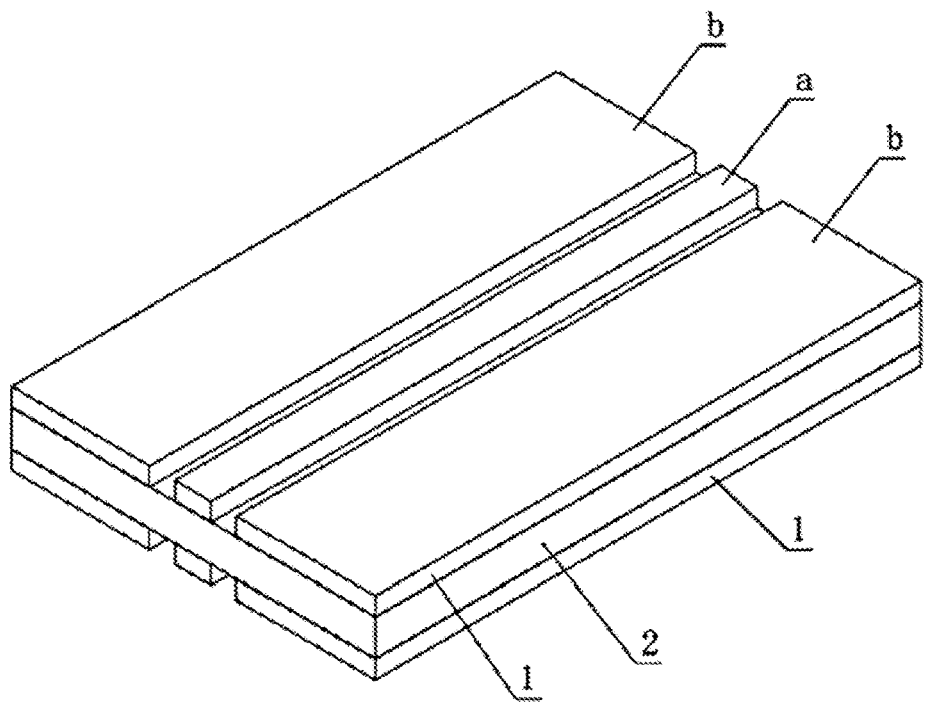
FIG. 1 is a schematic structural diagram of a low-loss transmission line structure provided by the present disclosure.
Figure 2:
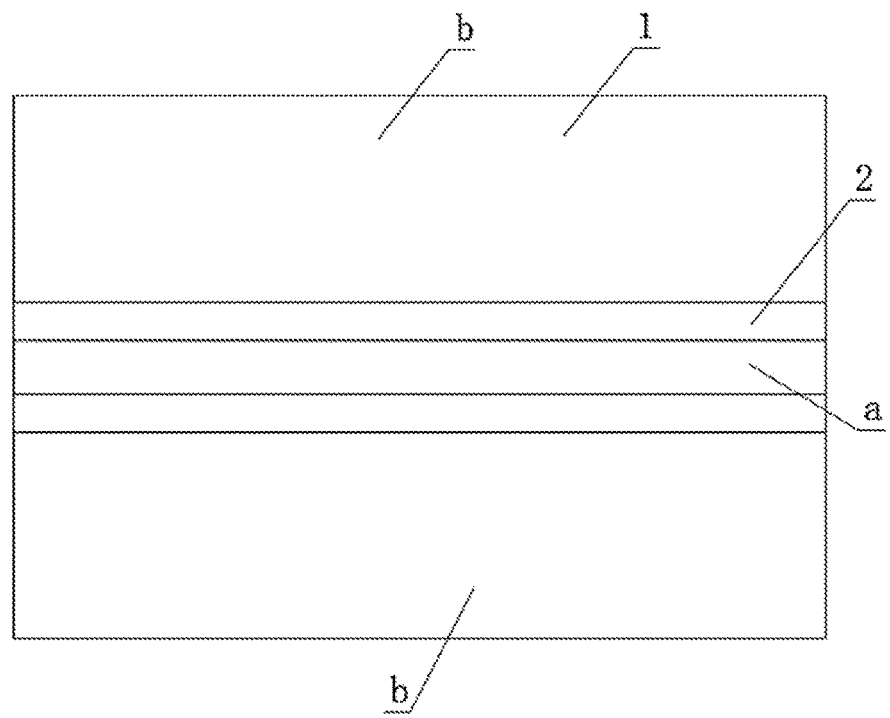
FIG. 2 is a top view of a low-loss transmission line structure provided by the present disclosure.
Figure 3:
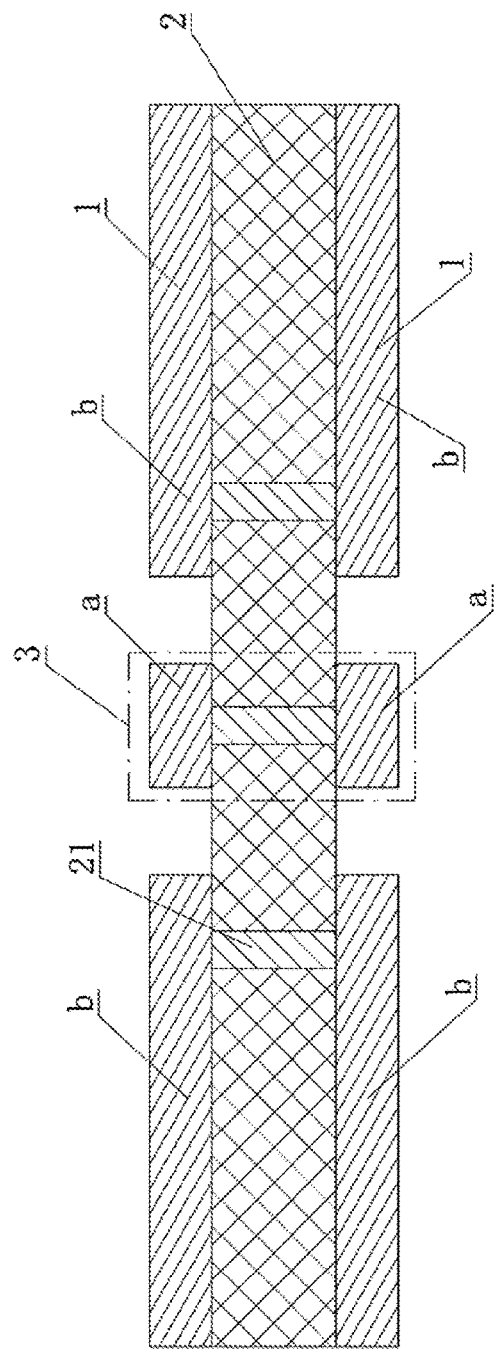
FIG. 3 is a cross-sectional view of a low-loss transmission line structure provided by the present disclosure.

Referring to FIG. 1 to FIG. 3, the disclosure provides a low-loss transmission line structure, which includes at least two metal layers 1 stacked in a vertical manner. A dielectric layer 2 is filled between the adjacent metal layers 1. The metal layer 1 includes a signal transmission strip a in a middle portion. The signal transmission strips are used to transmit electromagnetic wave signals. There are ground strips b on both sides of the signal transmission strip a. The ground strip b is used for grounding. There are through holes 21 (as shown in FIG. 3) evenly distributed on the dielectric layer 2, and the signal transmission strips a on each metal layer 1 are connected via the through holes 21 (as shown in FIG. 3) to form a signal transmission line 3. The ground strips b on each metal layer 1 are connected through the through hole 21 (as shown in FIG. 3). The through holes 21 (as shown in FIG. 3) between the signal transmission strips a and the through holes 21 (as shown in FIG. 3) between the ground strips b may be arranged in a single row or in multiple rows, and may be flexibly selected according to the actual transmission line size.

Referring to FIG. 1 to FIG. 3, the number of metal layers 1 is two layers, and a single metal layer may form a "ground-signal-ground" structure. For the "ground-signal-ground" structure composed of the single metal layer 1, the distance between the signal transmission strip a and the ground strip b may be designed according to actual requirements. In the meantime, a structure in which one side of the ground strip b is grounded may also be used to form a "ground-signal" structure, that is, only one side of the ground strip b on both sides of the signal transmission strip a is grounded. The two layers of the signal transmission strips a are connected via the through holes 21 (as shown in FIG. 3), and the ground strips b on the upper and lower layers are also connected via the through holes 21 (as shown in FIG. 3).

The present disclosure will be further described below with reference to specific drawings and embodiments.

Embodiment 1

Figure 4:
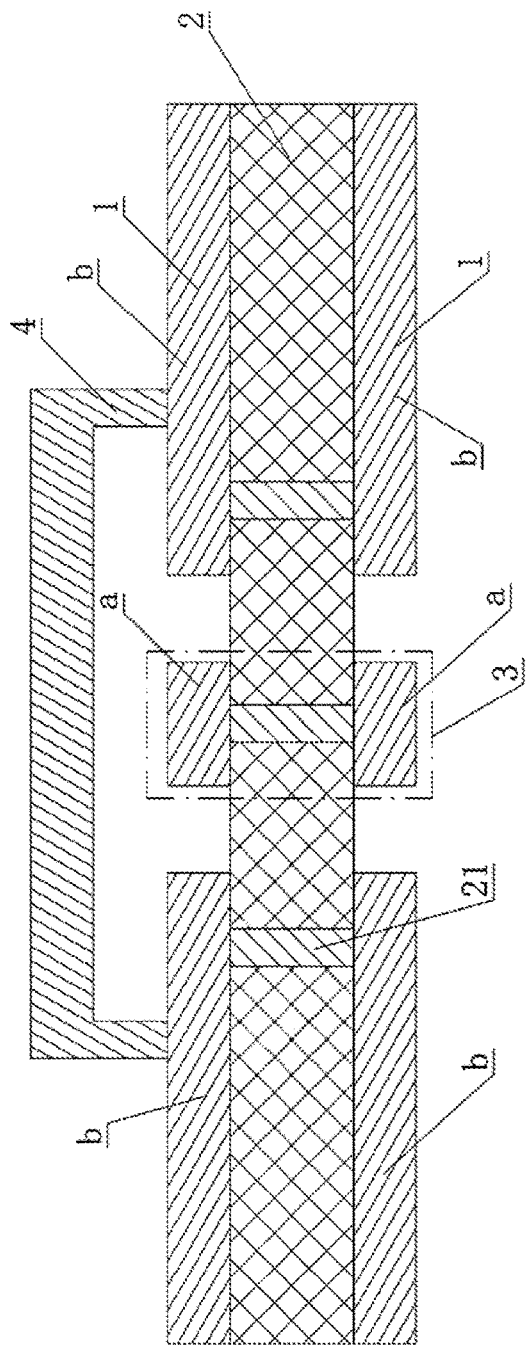
FIG. 4 is a cross-sectional view of Embodiment 1 provided by the present disclosure.
Figure 5:
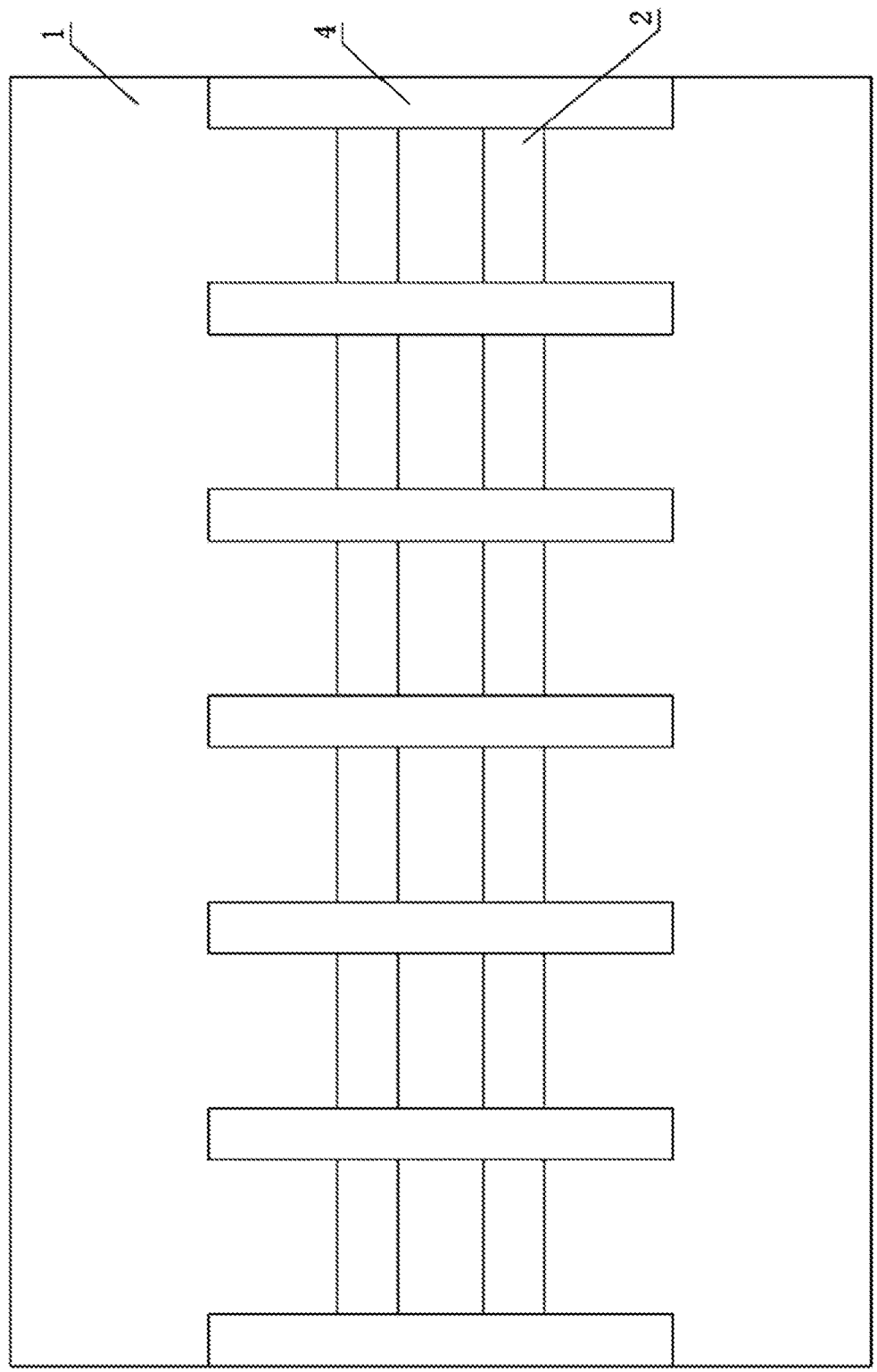
FIG. 5 is a top view of Embodiment 1 provided by the present disclosure.
Figure 6:
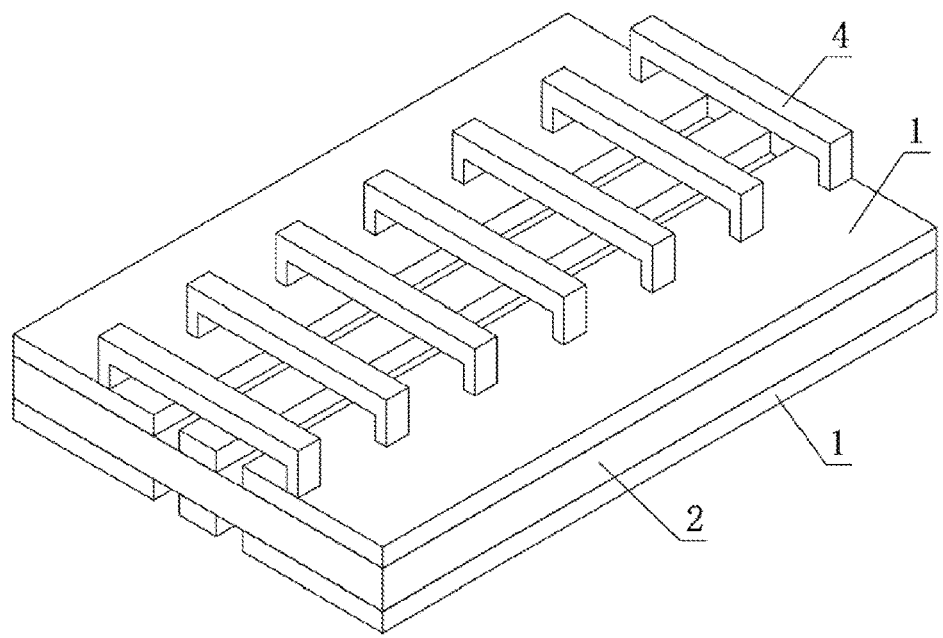
FIG. 6 is a schematic structural diagram of Embodiment 1 provided by the present disclosure.
Figure 7:
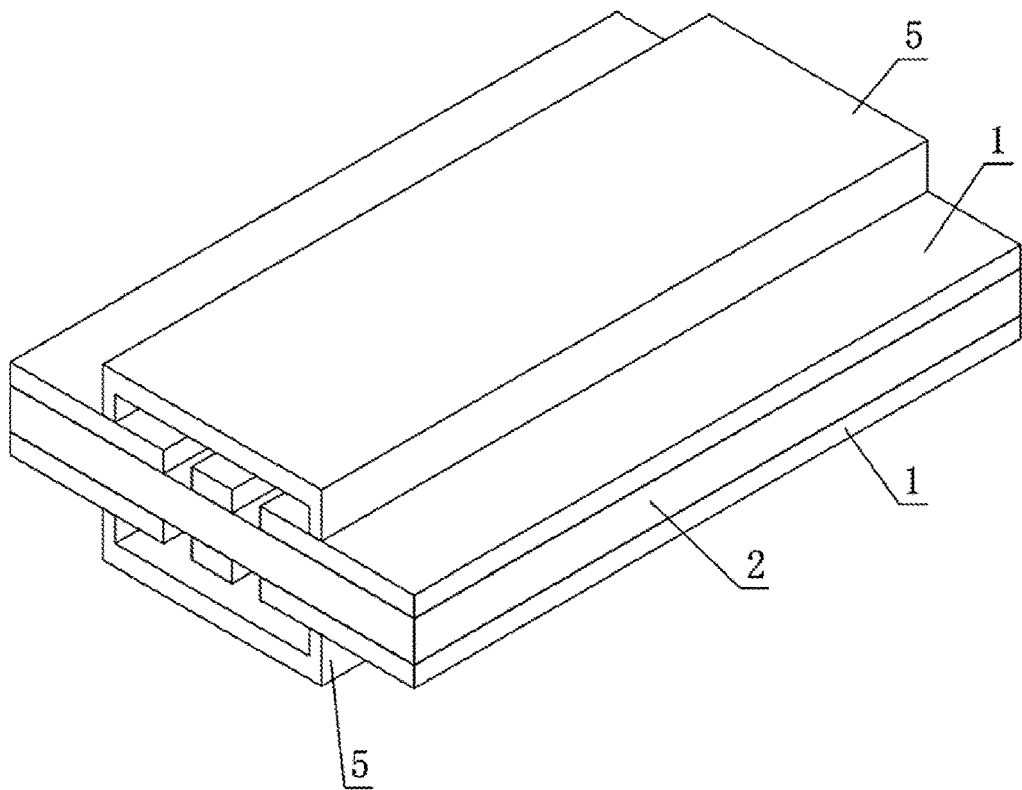
FIG. 7 is a schematic structural diagram of a metal shield in Embodiment 1 provided by the present disclosure.
Figure 10:
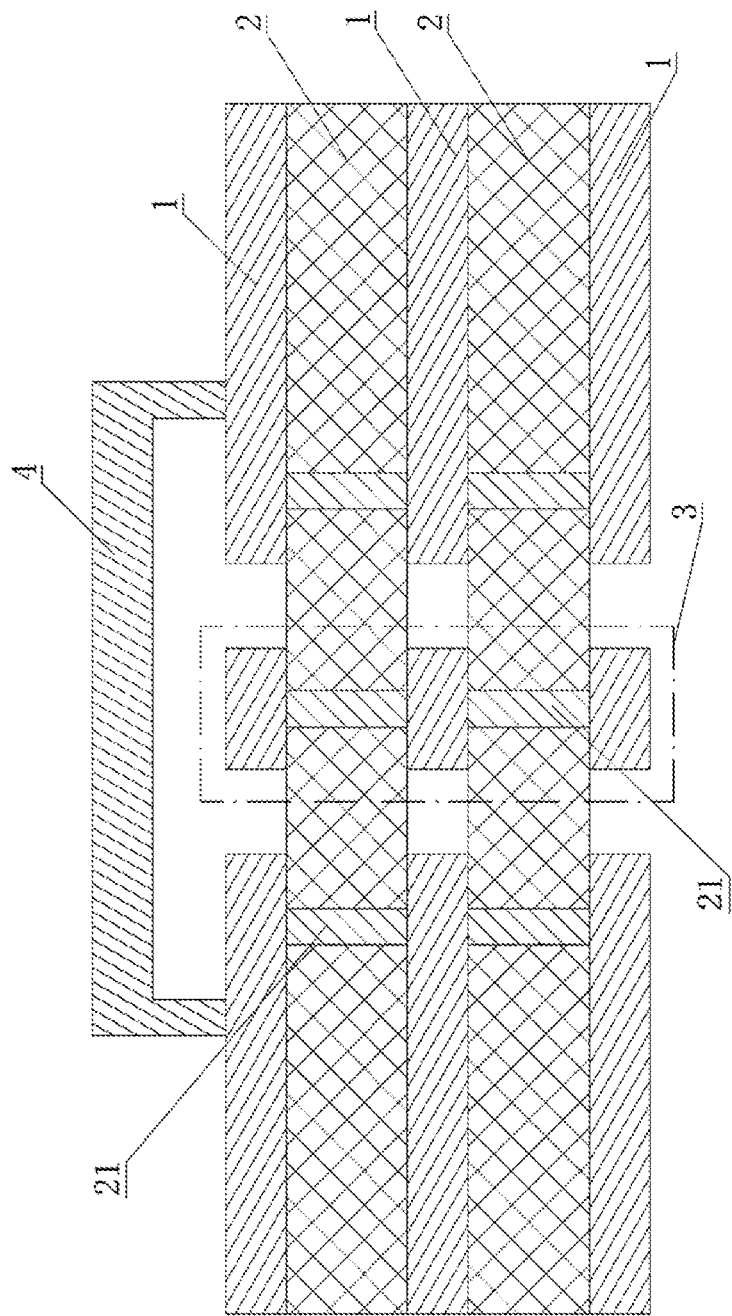
FIG. 10 is another structural schematic diagram of a low-loss transmission line structure provided by the present disclosure.

Referring to FIG. 4 to FIG. 7, this embodiment is a further improvement based on FIG. 1 to FIG. 3. In this embodiment, preferably, the dielectric layer 2 is made of epoxy fiberglass cloth substrate (FR4) material. The material may be adjusted according to actual requirements. The type of material for the dielectric layer 2 is not limited to the epoxy fiberglass cloth substrate (FR4). The dielectric layer 2 is not limited to epoxy fiberglass cloth substrate, and may be made of dielectric plate whose surface can be printed with metal, such as quartz, glass and other dielectric plates whose surface can be printed with metal, or may be of low-loss microwave dielectric plates, such as microwave dielectric ceramic plate. Furthermore, when the low-loss transmission line achieves the grounding effect, in order to reduce the interference caused by the asymmetric grounding environment on both sides of the signal transmission line, the ground strips b (as shown in FIG. 4) on the uppermost metal layer 1 are connected through a low-loss connection structure, preferably, the low-loss connection structure is a metal jumper 4 (as shown in FIG. 4 to FIG. 6) or a gold-wire bonding wire or any other structure that may connect the ground strips b (as shown in FIG. 4) on both sides with low loss. In this embodiment, it is preferred to use the metal jumper 4 (as shown in FIG. 4 to FIG. 6) for connection, the metal jumpers 4 (as shown in FIG. 4 to FIG. 6) are evenly distributed on the metal layer 1. Furthermore, the spacing between the metal jumpers 4 (as shown in FIG. 4 to FIG. 6) is not strictly limited. Furthermore, the metal jumpers 4 (as shown in FIG. 4 to FIG. 6) may be connected to form the entire metal shield 5 (as shown in FIG. 7). Further, as shown in FIG. 4 and FIG. 7, the ground strips b (as shown in FIG. 4) on the uppermost metal layer 1 and the ground strips b (as shown in FIG. 4) on the lowermost metal layer 1 are connected to each other through the metal shield 5 (as shown in FIG. 7). Moreover, as shown in FIG. 4 to FIG. 6, the metal jumper 4 (as shown in FIG. 4 to FIG. 6) may be consists of metal sheets, surface mount components or other equivalent structures, in which the surface mount components are respectively disposed on the ground strips b (as shown in FIG. 4) on both sides of the signal transmission strip a (as shown in FIG. 4), and the surface mount components are connected through the metal sheet across the signal transmission strip a (as shown in FIG. 4). Referring to FIG. 10, which is a stacked structure formed by three metal layers 1. The number of metal layers 1 may be adjusted according to actual needs.

Embodiment 2

Figure 8:
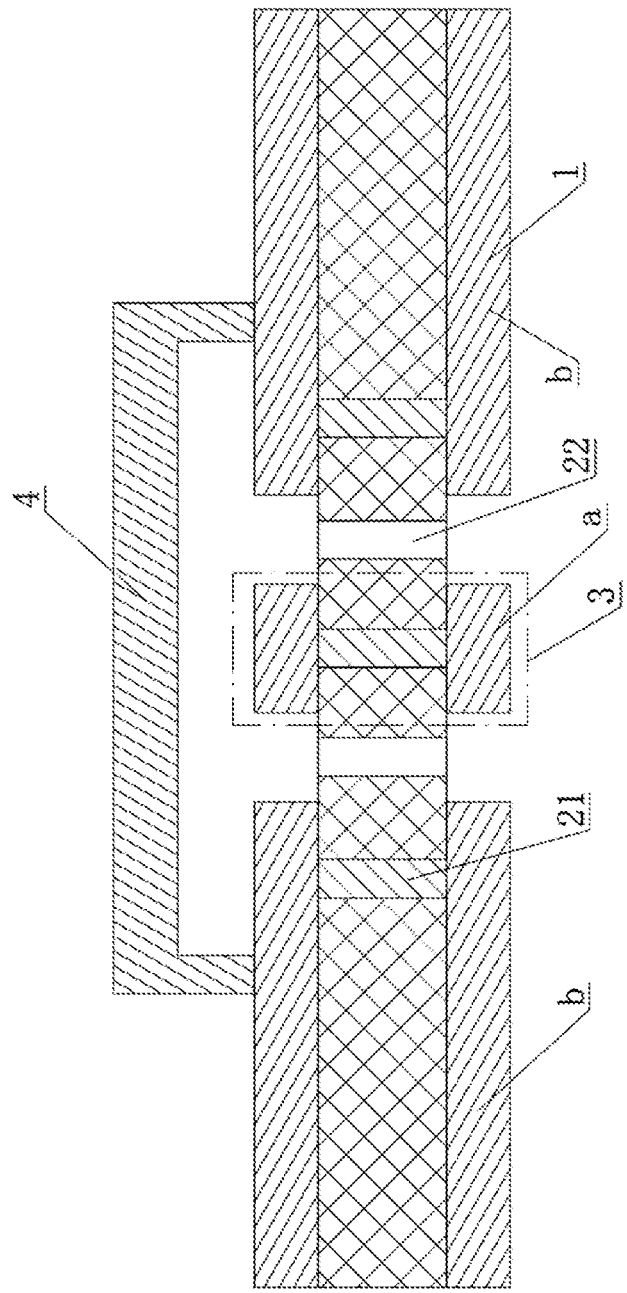
FIG. 8 is a cross-sectional view of Embodiment 2 provided by the present disclosure.
Figure 9:
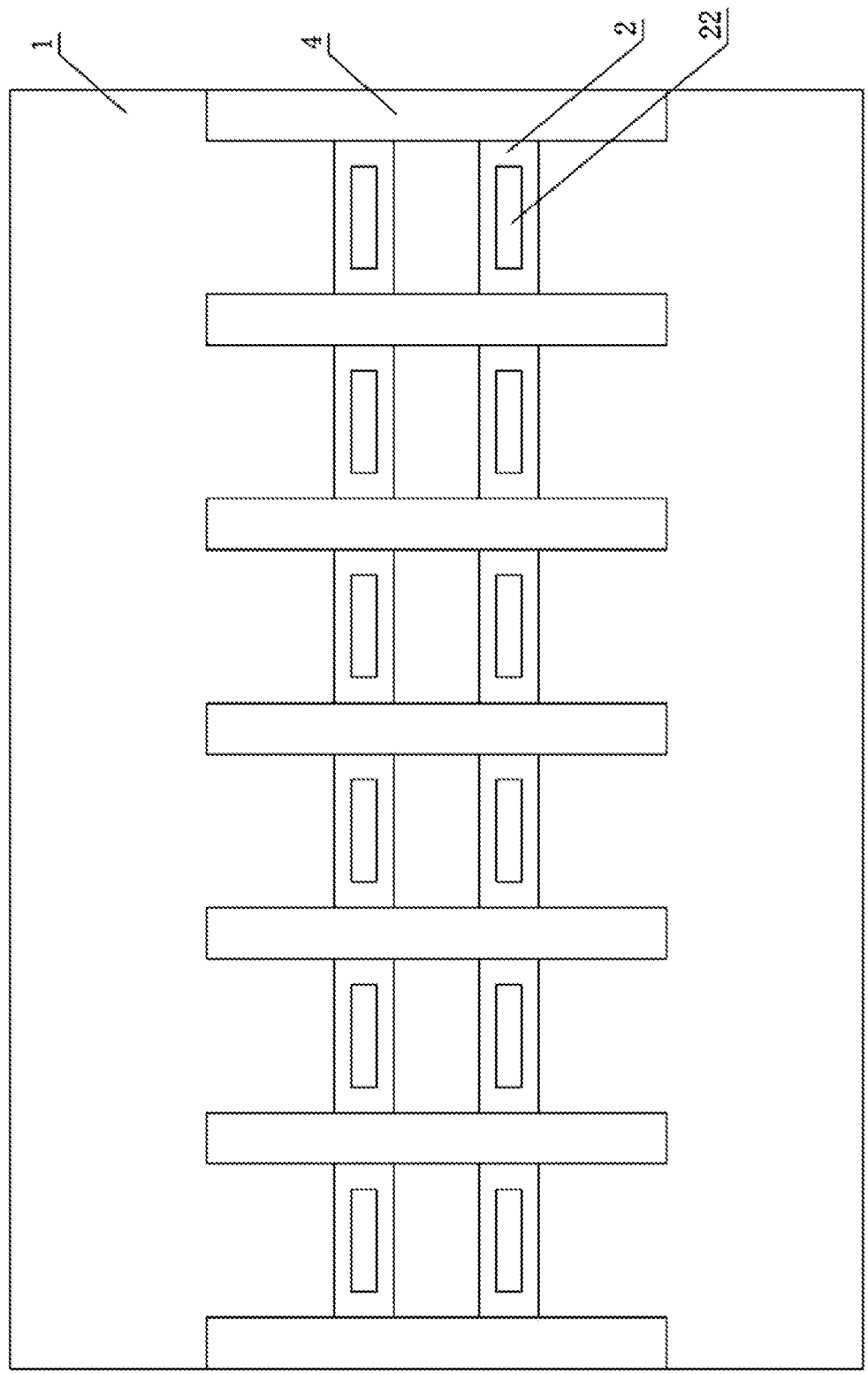
FIG. 9 is a top view of Embodiment 2 provided by the present disclosure.

As shown in FIG. 8 and FIG. 9, this embodiment is a further improvement based on Embodiment 1, and is specifically as follows:

Referring to FIG. 8 to FIG. 9, in order to further reduce the loss of the dielectric layer 2 (as shown in FIG. 9) during signal transmission, air grooves 22 are evenly distributed on both sides of the dielectric layer 2 (as shown in FIG. 9) close to the signal transmission strip a (as shown in FIG. 8). As shown in FIG. 9, by reducing the effective volume of the dielectric layer 2, the loss of the transmission signal is further reduced. Furthermore, the air groove 22 may be designed in a variety of shapes. The shape of the air grooves 22 is circular or polygonal. Specifically, in addition to the square air groove shown in the figure, the air groove may also be changed into a cylindrical shape, a square with rounded corners, and other polygonal shapes. Furthermore, the air grooves 22 may be through grooves that penetrate a upper and lower surfaces of the dielectric layer 2 or shallow grooves that are located on the upper and lower surfaces of the dielectric layer 2 and are not communicated with each other.

Figure 11:
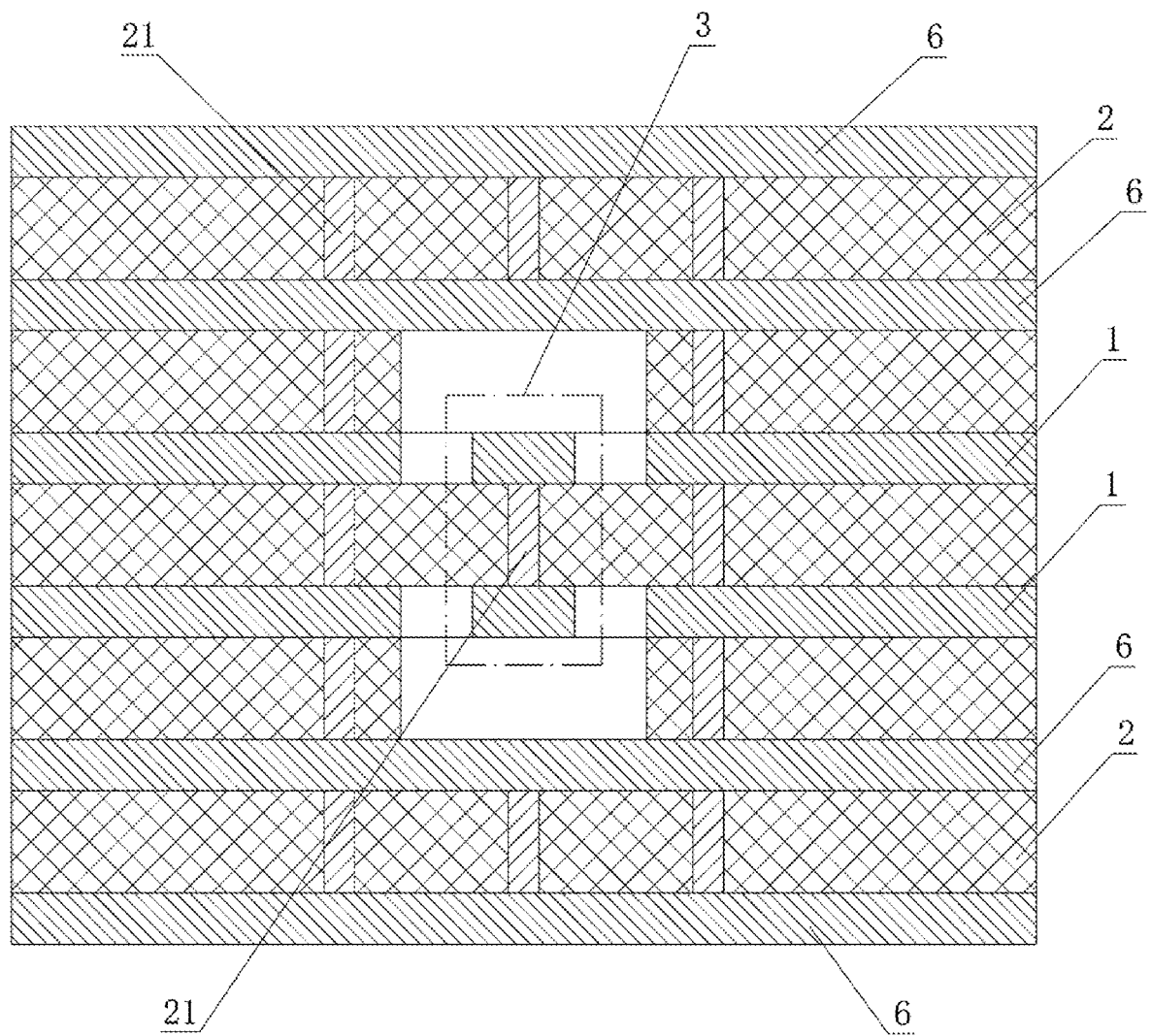
FIG. 11 is a schematic cross-sectional view of the structure of a dielectric integrated suspension line applied in the present disclosure.

In order to apply the structure of the present disclosure to the dielectric integrated suspension line structure, the realization may be achieved by changing the grounding method of the structure of the disclosure. Specifically, as shown in FIG. 11, the uppermost and lowermost metal layers 1 are connected to multiple ground metal layer 6 through the dielectric layer 2, and the dielectric layer 2 is filled between the ground metal layers 6. The ground metal layers 6 are connected through the through holes 21 to achieve a more stable grounding effect.

Figure 12:
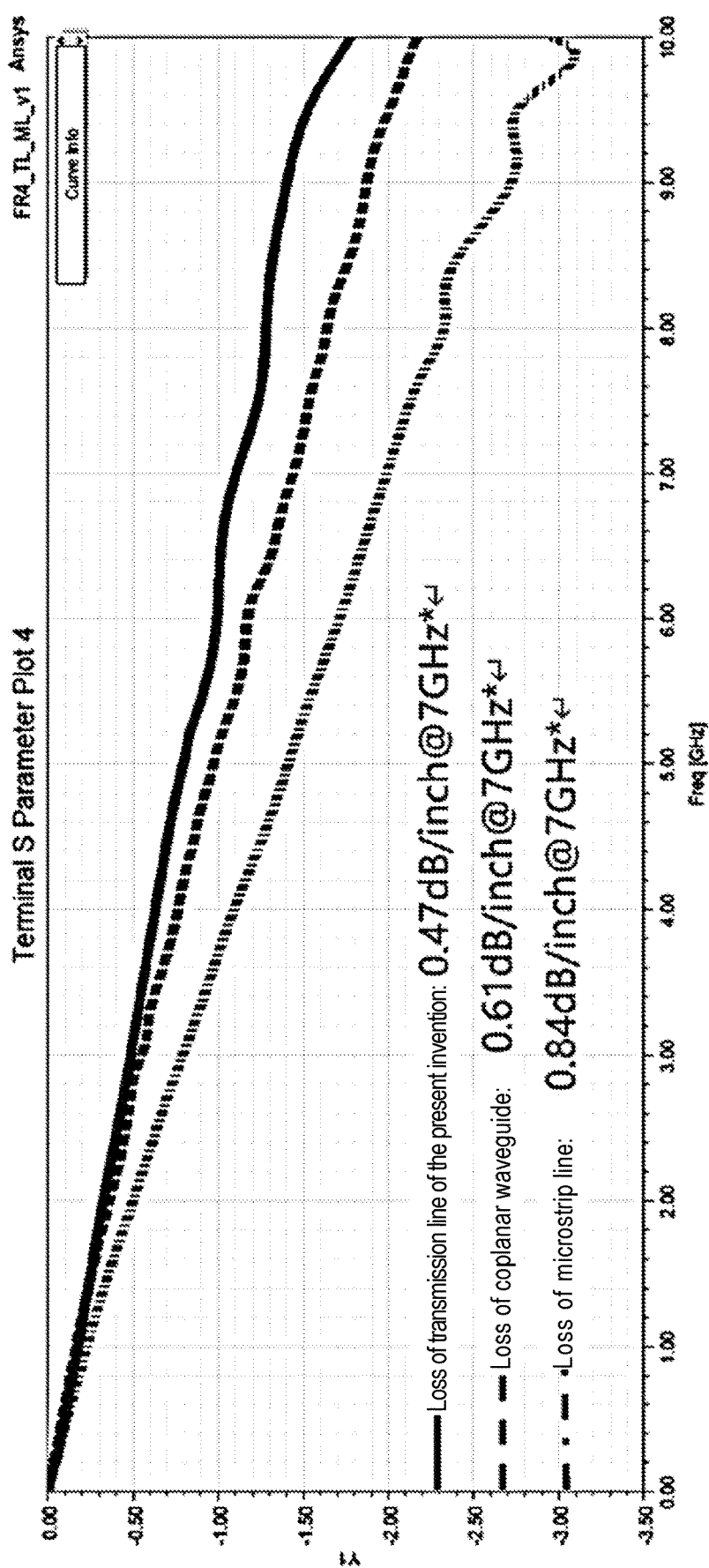
FIG. 12 is a loss comparison diagram of a low-loss transmission line structure provided by the present disclosure.

In order to further intuitively verify that the transmission line structure of the present disclosure has low loss characteristics, FIG. 12 shows a terminal S Parameter Plot 4 of transmission loss curves Y1 vs. frequency in GHz of the structure in Embodiment 1 of the present disclosure using microstrip line and coplanar waveguide respectively in the condition where the transmission lines have an equal length and the medium has the same material and same thickness. It can be seen that the corresponding losses of the transmission lines of the three structures are the loss of the present disclosure at 0.47 dB/inch@7 GHz, the loss of the coplanar waveguide at 0.61 dB/inch@7 GHZ, and the loss of the microstrip at 0.84 dB/inch@7 GHz, respectively. The structure of the present disclosure has the lowest loss.

By using the low-loss transmission line structure provided by the present disclosure, it is possible to allow most of the electromagnetic field around the transmission line to exist in the air, thereby effectively reducing losses during signal transmission. In the meantime, as shown in FIG. 3, the signal transmission strips a on two or more metal layers are connected through the through holes 21 to form a structure of the signal transmission line 3, so it is possible to reduce conductor loss and increases power capacity.

It is easy for those skilled in the art to understand that the above descriptions are only preferred embodiments of the present disclosure and are not intended to limit the present disclosure. Any modifications, equivalent substitutions and improvements, etc., made within the spirit and principles of the present disclosure should all be included in the scope to be protected by the present disclosure.

What is claimed is:

1. A low-loss transmission line structure, comprising:
    at least two metal layers, stacked in a vertical manner and spaced apart from each other, wherein a middle portion of each of the at least two metal layers serves as a signal transmission strip, the respective signal transmission strip is disposed to transmit an electromagnetic wave signal, remaining portions of the at least two metal layers on both sides of the respective signal transmission strip serve as ground strips, the respective ground strips and the respective signal transmission strip are spaced apart; and
    at least one dielectric layer, is disposed between the at least two metal layers, the dielectric layer is provided with through holes, the respective signal transmission strips on each of the at least two metal layers are connected by the through holes to form a signal transmission line, and the respective ground strips on each of the at least two metal layers are connected by the through holes, and the low-loss transmission line structure is able to allow most of an electromagnetic field around the low-loss transmission line structure to exist in air, thereby effectively reducing a loss during a signal transmission, the through holes do not penetrate the respective signal transmission strip and the respective ground strips, wherein air grooves are evenly distributed in the dielectric layer close to the respective signal transmission strip.

2. The low-loss transmission line structure according to claim 1, wherein the respective ground strips on an uppermost one of the at least two metal layers are connected to each other through a low-loss connection structure, and the low-loss connection structure is at least one metal jumper or a gold-wire bonding wire.

3. The low-loss transmission line structure according to claim 2, wherein the at least one metal jumper is connected to each other to form a metal shield.

4. The low-loss transmission line structure according to claim 3, wherein the respective ground strips on the uppermost one of the at least two metal layers and the respective ground strips on a lowermost one of the at least two metal layers are connected to each other through the metal shield.

5. The low-loss transmission line structure according to claim 1, wherein the air grooves are through grooves that penetrate upper and lower surfaces of the dielectric layer.

6. The low-loss transmission line structure according to claim 1, wherein a shape of the air groove is circular or polygonal.

7. The low-loss transmission line structure according to claim 1, wherein the dielectric layer is made of an epoxy glass fiber cloth substrate, or a dielectric plate whose surface is able to be printed with metal, or a low-loss microwave dielectric plate.

8. The low-loss transmission line structure according to claim 1, wherein the low-loss transmission line structure is applied in a dielectric integrated suspension line structure, the ground strips are multiple ground metal layers respectively disposed on a uppermost one of the at least two metal layers and a lowermost one of the at least two metal layers in the stacked manner and spaced apart from each other, the at least one dielectric layer is disposed between the multiple ground metal layers which are spaced apart from each other in the stacked manner, and the multiple ground metal layers are connected through the through holes.

* * * * *